United States Patent [19]

Ferreri et al.

[11] Patent Number: 4,775,942

[45] Date of Patent: Oct. 4, 1988

[54] SEED AND STITCH APPROACH TO EMBEDDED ARRAYS

[75] Inventors: Raymond J. Ferreri, Stormville; Douglas B. Fields, Wappingers Falls; Walter R. Heitmueller, Poughkeepsie, all of N.Y.

[73] Assignee: International Business Machines Corporation, Armonk, N.Y.

[21] Appl. No.: 806,650

[22] Filed: Dec. 9, 1985

[51] Int. Cl.$^4$ ............................................ G06F 15/606
[52] U.S. Cl. ...................................... 364/491; 357/45; 364/300; 364/900; 365/51
[58] Field of Search ............... 364/488, 489, 490, 491, 364/300, 518, 521, 900 MS File; 365/51, 189; 357/42, 45

[56] References Cited

U.S. PATENT DOCUMENTS

| T101,804 | 5/1982 | Balyoz et al. ........................ 357/15 |
| 4,233,674 | 11/1980 | Russell et al. ........................ 365/200 |
| 4,538,183 | 8/1985 | Kanno et al. ........................ 364/523 |
| 4,584,653 | 4/1986 | Chih et al. ........................ 364/488 |
| 4,612,618 | 9/1986 | Pryor et al. ........................ 364/490 |
| 4,613,941 | 9/1986 | Smith et al. ........................ 364/490 |
| 4,627,015 | 12/1986 | Stephens ........................ 364/900 |
| 4,668,972 | 5/1987 | Sato et al. ........................ 357/45 |
| 4,688,072 | 8/1987 | Heath et al. ........................ 364/491 X |
| 4,701,860 | 10/1987 | Mader ........................ 364/488 X |

FOREIGN PATENT DOCUMENTS 0050022 9/1981 European Pat. Off. .
2739952 3/1979 Fed. Rep. of Germany .

OTHER PUBLICATIONS

Ohkura et al., "A CMOS Gate Array for Computer Applications", *Proceedings of the IEEE International Conference on Computer Design: VLSI in Computers*, Nov. 2, 1983, pp. 268-271.

Tanaka et al., "An Integrated Computer Aided Design System for Gate Array Masterslices", *IEEE 18th Design Automation Conference*, 1981, pp. 812-819.

*MacPaint*, a Manual for the Apple Macintosh, 1983.

Kessler et al., "Standard Cell VLSI Design: A Tutorial", *IEEE Circuits and Devices Magazine*, Jan. 1985, pp. 17-34.

Hu et al., "Theory and Concepts of Circuit Layout", *VLSI Circuit Layout: Theory and Design*, IEEE Press, 1985, pp. 3-18.

Trimberger et al., "Automating Chip Layout", *IEEE Spectrum*, Jun. 1982, vol. 19, No. 6, pp. 38-45.

Franco et al., "The Cell Design System", *IEEE 18th Design Automation Conference*, 1981, pp. 240-247.

Reingold et al., "A Heirarchy-Driven Amalgamation of Standard and Macro Cells", *IEEE Transactions on Computer-Aided Design*, vol. CAD-3, No. 1, Jan. 1984, pp. 3-11.

(List continued on next page.)

*Primary Examiner*—Parshotam S. Lall
*Assistant Examiner*—Joseph L. Dixon
*Attorney, Agent, or Firm*—Peter L. Michaelson

[57] ABSTRACT

A method, for producing a multi-layer metallization pattern (macro) for a custom sized memory embedded on a masterslice, is disclosed. The memory has "n" addresses and stores "m" bits at each address. Specifically, the memory relies on using macros for a "seed" portion and a "stitch" portion of the memory. The seed portion is a small complete memory. The seed contains all the ancillary support circuitry, e.g. address decoders and true/complement generators, used by the entire embedded memory and a small amount of memory locations, typically having "n" rows each one or two bits wide, with their associated data transfer circuits. A "stitch" is one column of "n" memory locations and the data transfer circuits required to serve these locations. Once the macro for the seed is appropriately positioned on the masterslice, then the stitch macro is replicated as many times as needed in contiguous columns outwardly spaced from and vertically aligned with the seed in order to provide the desired number of bits ("m") in each row of the embedded memory. Vertically aligning all the stitches with the seed ensures that corresponding rowlines located within the seed and in each stitch are joined together.

23 Claims, 10 Drawing Sheets

OTHER PUBLICATIONS

Donze et al., "Philo-A VLSI Design System", *IEEE 19th Design Automation Conference*, 1982, pp. 163-169.

Lopez et al., "A Dense Gate Matrix Layout Method for MOS VLSI", IEEE Trans. Electron Devices, vol. ED-27, pp. 1671-1675, Aug. 1980.

P. S. Balasubramanian et al., "Automatic RAM Macro Design System", IBM Technical Disclosure Bulletin, vol. 24, No. 2, Jul. 1981, pp. 950-951.

D. Bursky, "Distinctions Blur Between Gate Arrays and Cells as Digital Technology Evolves, Electronic Design, vol. 33, No. 14, 13 Jun. 1985, pp. 81-86.

A. H. Dansky et al., "TTL Masterslice Cell Designed to Make Efficient Random-Access Memory Macros", IBM Technical Disclosure Bulletin, vol. 22, No. 8A, Jan. 1980, pp. 3230-3232.

| FIG. 2A | FIG. 2B |

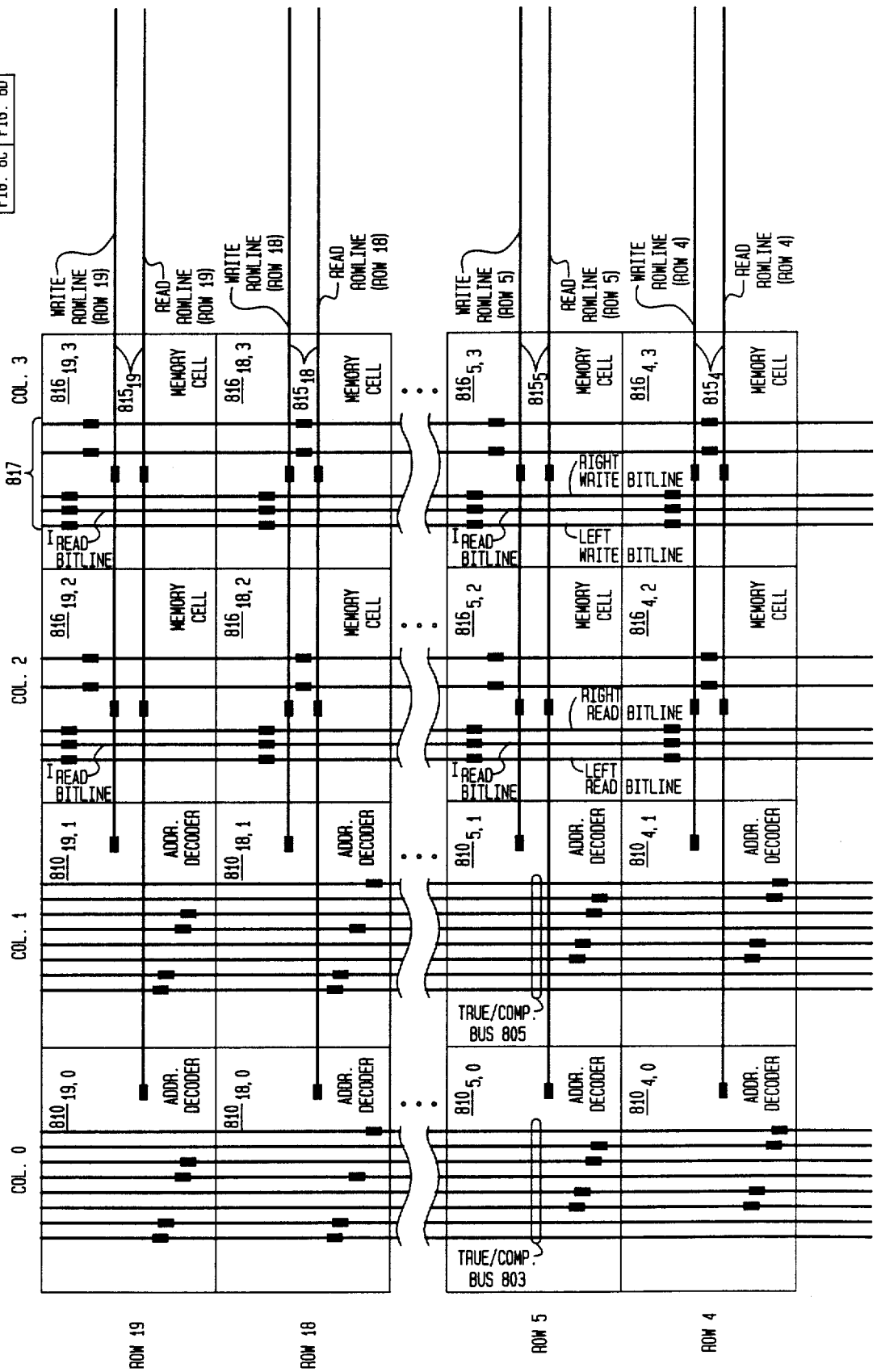

SEED AND STITCH APPROACH TO EMBEDDED ARRAYS

BACKGROUND OF THE INVENTION

1. Field of the Invention

The present invention relates to a method for producing small memory arrays embedded on masterslices.

2. Description of the Prior Art

Digital integrated circuits are becoming increasingly dense as a consequence of continuing miniaturization of integrated components and integrated line widths. As a result, these circuits are becoming increasingly sophisticated. Such circuits are typically fabricated using one of two techniques: use of a fully customized chip or use of a masterslice. The custom chip technique requires that the chip be completely designed for the particular circuit, i.e. the integrated circuit elements themselves (e.g. the transistors and resistors, their layout and their interconnect lines are dictated solely by the particular circuit being implemented. This technique produces chips having a higher density than those produced using the masterslice technique. However, this custom chip technique, particularly for large and dense integrated circuits, necessitates expensive and time consuming engineering and manufacturing efforts.

In contrast, the masterslices techique involves fabricating a number of closely spaced identical cells in an array configuration over a relatively large section of the available area on each chip. Each cell contains an identical arrangement of various integrated elements, such as transistors, diodes and/or resistors. Through a particular metallization layer applied over the surface of each cell, the components situated therein can be interconnected to form a specific logic circuit, e.g. a single bit register, a gate, a single bit memory cell and the like. Thereafter, another metallization layer is applied over the surface of the masterslice to interconnect the cells in a particular pre-defined pattern in order to implement one or more given functions, e.g. multi-bit registers, random access memories, and large shift registers. A portion of a masterslice can be allocated to any given function and, as such, several different circuits can exist on one masterslice. Consequently, masterslices can be used to implement a wide variety of different digital circuits. Because a masterslice contains a pre-defined regularly ordered arrangement of identical cells, with only the multi-layer metallization pattern being dictated by the application, masterslices can be easily and inexpensively designed using an automated design process. Although the masterslice technique produces somewhat lower density chips than does the custom chip technique, the masterslice technique offers substantial cost and time savings in the design of a dense chip over those associated with the custom chip technique. These savings quickly become substantial when a large number of different dense large scale integrated circuit (LSI) chips need to be designed and manufactured. As a result, sophisticated logic circuits can be manufactured using the masterslice technique at a fraction of the time and at a substantial cost saving over that required by the custom chip design technique. Hence, for those reasons, an increasing number of dense logic chips are being designed using the masterslice technique.

Oftentimes, an integrated circuit requires a small amount of memory to implement a specialized function, such as a stack or small cache memory. In the past, without masterslices, such memories were implemented using either special on-chip registers or latches, or through specialized off-chip circuitry. Unfortunately, on-chip registers consumed an inordinate amount of chip area and also increased the power consumed by the chip; while, alternatively, routing signals to off-chip circuitry decreased the speed at which the integrated circuit could operate.

Masterslices permit large and small memory arrays to be embedded on an integrated circuit chip. This eliminates the need to construct these memories from on-chip registers and thereby reduces any adverse affect of the memory on the amount of power consumed by the chip. Either one of two separate approaches, both well known in the art, is often used to implement such memories on a masterslice. Each approach possesses various drawbacks.

Specifically, the first approach relies on allocating a specific area on the masterslice only to memories. No other circuits could be implemented in this area. Hence, if memories smaller than this area are implemented, then any remaining area is simply not used. Consequently, chip area is wasted. Clearly, the amount of wasted area depends upon the size of the necessary memory; the smaller the memory, the more area that is wasted. Moreover, this approach only permits the memory to be located in a specific region on the masterslice. Consequently, this leads to a fairly rigid set of layout constraints. In addition, if a memory requires more area than that allocated on the chip, then off-chip memory is used which disadvantageously imparts a speed penalty to the entire memory.

The alternate approach for embedding memories in masterslices involves implementing the memory using pre-defined memory array macros (pre-defined multi-layer metallization patterns) that can be located anywhere on the masterslice. Each macro produces a small complete memory of a pre-determined size that can be interconnected to memory arrays produced by other memory array macros in order to form large memory arrays. Unfortunately, the smallest memory array macro that is often used (illustratively 16 by 9 bits) is frequently too large to implement some small (e.g. 16 by 6 bit) on-chip memories. The remedy for this is to design either an entirely customized memory array or a new smaller memory array macro, or simply utilize an existing memory array macro that has more locations than necessary. The first two remedies consume excessive engineering time and are therefore to be avoided; while the third remedy only wastes chip area and power. For that reason, the third remedy is frequently taken although it yields an inefficient chip layout.

Thus, a need exists in the art for a method for producing a small embedded memory which can be located anywhere on the masterslice and contains only the exact number of memory locations that are required.

SUMMARY OF THE INVENTION

Accordingly, an object of the present invention is to provide a method for producing a small custom sized memory which can be embedded in a masterslice.

A specific object is to provide such a method that generates a layout macro of the entire embedded memory that contains only the exact number of locations that are needed and thereby conserves chip area on the masterslice.

A further specific object is to provide such a method that allows the memory to be located anywhere on the masterslice and thereby leads to efficient chip layouts.

A more specific object is to provide such a method that permits an embedded memory to be easily configured to any size without expending a significant amount of engineering time and effort.

Another object is to provide such a method that can be implemented on computer aided design equipment.

These and other objects are provided in accordance with the teachings of the present invention by: defining a first column of a memory wherein a layout macro for an address decoder, containing a first horizontally oriented rowline, is positioned in each of a plurality of cells in a first column of a cellular array which holds the embedded memory and the plurality equals at least the number of desired rows of storage locations in the memory; defining a second column of the memory wherein an identical layout macro for a storage cell, containing a second horizontally oriented rowline, is positioned in each of a plurality of cells in a second column of the cellular array such that the second horizontally oriented rowline appearing in each storage cell in the second column is vertically aligned with a corresponding one of the first horizontally oriented rowlines in the first column; and successively replicating the layout macro for the entire second column of the array a sufficient number of times in successive columns of the array outwardly spaced from the first column of cells so as to provide the desired number of bits in each row of the memory.

In essence, the macro (multi-layer metallization pattern) for an embedded memory of a desired size is formed by first defining a "seed" macro, then defining a "stitch" macro and finally replicating the stitch macro, as many times as needed, in contiguous columns outwardly located from the seed—often positioned to the right of the seed.

In accordance with a specific illustrative embodiment of an memory embedded in a masterslice and constructed in accordance with the inventive method, the seed macro occupies two columns of the cellular array on the masterslice. To form the seed macro, a macro for a row address decoder is replicated in a number of vertically contiguous cells in the first column of the cellular array. This number equals the number of rows in the memory. Each of the remaining cells in the first column holds a replicated macro for support circuitry, such as true/complement generators, that are associated with and will be connected to a respective address decoder. Vertically oriented true/complement read and write address busses and horizontally oriented rowlines are then laid out in separate metallization layers that form part of the seed macro.

Thereafter, for each address decoder situated in the first column, a macro of a desired memory cell (e.g. 2 port, 4 port or the like) is successively positioned in each cell located in the second column and lying adjacent to an address decoder situated in the first column. Macros of data transfer circuits, e.g. read and write circuits, are replicated in the remaining cells in the second column. Vertically oriented bitlines running between each memory cell and the data transfer circuits are implemented in a particular metallization layer that forms part of the macro for this column. In this manner, the seed macro forms a small complete memory.

The stitch is identical to the column of memory cells and data transfer circuits located in the seed. For this specific embodiment, the stitch macro is identical to the second column of the seed. Hence, the stitch macro is repetitively replicated in successive columns outwardly spaced from the seed in order to provide the desired number of bits in each row and thereby expand the size of the memory formed by the seed. Each stitch provides one column of additional memory locations and contains an identical number of memory cells and the necessary read and write circuits for these cells. A complete memory usually contains the seed and at least one stitch.

As a result of accessing previously defined macros in order to define new macros (seed and stitch) and then replicating the stitch macro a certain number of times so as to define the macro for the entire embedded memory, the inventive technique saves considerable time in the layout of custom sized embedded memories.

BRIEF DESCRIPTION OF THE DRAWING

The principles of the present invention may be readily understood by considering the following detailed description in conjunction with the drawing, in which:

FIG. 8 shows the proper alignment of the drawing sheets for FIGS. 8A–8D; and

FIGS. 8A–8D are a diagram showing a simplified layout on a masterslice of a two port 16 by m random access memory constructed in accordance with the principles of the present invention and which forms another embodiment of memory 30 shown in FIG. 1.

To facilitate understanding, identical reference numerals have been used to denote identical elements common to the figures.

DETAILED DESCRIPTION

After reading the following discussion, those skilled in the art will readily appreciate that the principles of the present invention are applicable to constructing any circuit that is to be embedded in a masterslice and is to contain a repetitive circuit pattern. For example, such circuits include embedded memories, typified by: read only memories (ROMs), programmable read only memories (PROMs) and/or electrically programmable read only memories (EPROMs), random access memories (RAMs). Moreover, these memories can be either single port (a common read and write port) or multi-port (more than one separate read and write ports). Other types of embedded circuits having repetitive patterns and which can be constructed in accordance with the principles of the present invention illustratively include shift registers and programmable logic arrays (PLA). As an illustrative example, the inventive memory will be discussed in the context of two and four port random access memories. Thereafter, those skilled in the art will clearly understand how other types of embedded memories and other embedded repetitive circuits can be implemented using the principles of the present invention.

Figure 1:
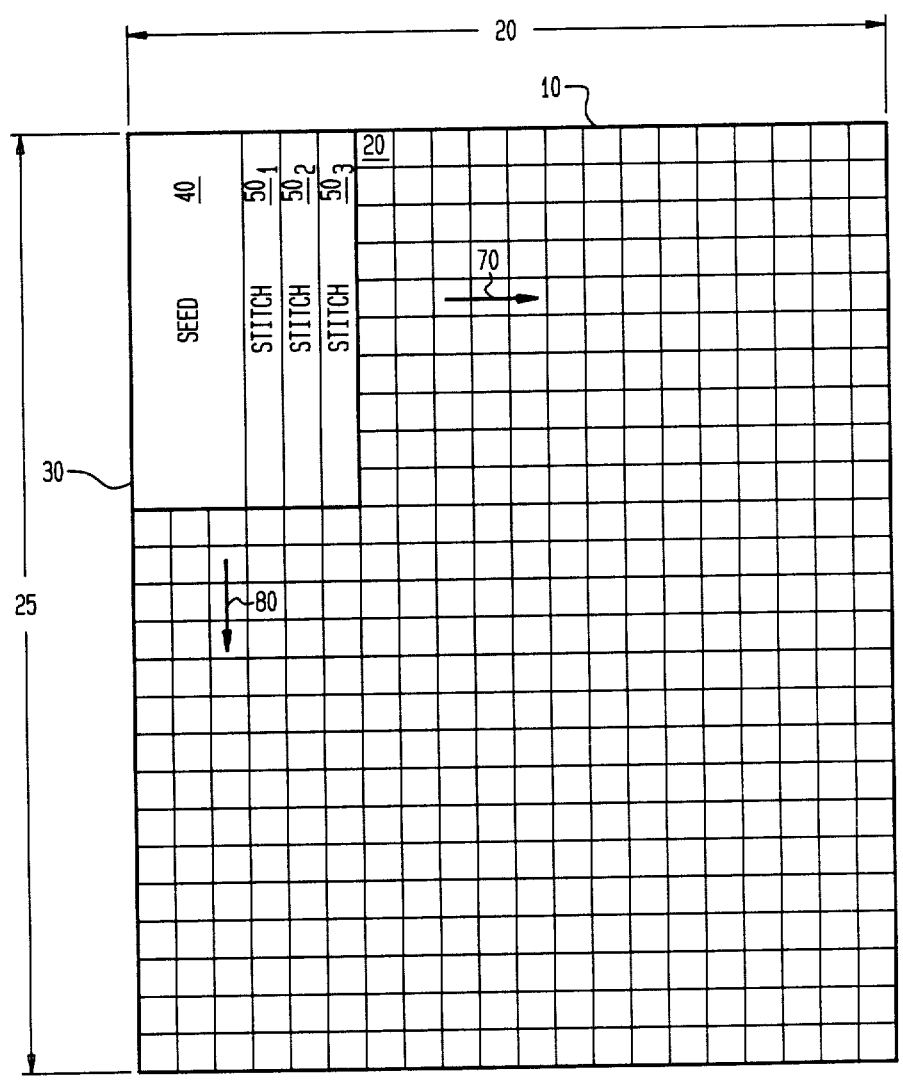
FIG. 1 depicts a simplified layout of a typical masterslice containing embedded memory 30 which embodies the principles of the present invention.

FIG. 1 depicts a simplified layout of masterslice 10. The masterslice typically contains an grid-like arrangement of identical cells 20, each of which contains an identical arrangement of well-known integrated components, e.g. transistors, resistors and the like. Illustratively, masterslice 10 contains 500 cells organized in a rectangular pattern of 25 rows of 20 cells each. A multi-layer custom metallization pattern (a layout macro—henceforth referred to as merely a macro) is applied over the entire surface of the masterslice as one of the final steps in its manufacture. This pattern interconnects the integrated components in each cell to form a desired logic element and also interconnects the cells together to form a desired circuit.

Inventive memory 30 is illustratively shown as being situated in a cellular array located in the upper left corner of masterslice 10. The memory has "n" addresses and stores "m" bits at each address. This memory contains two distinct portions: a seed and a stitch. In general and as discussed in greater detail below, the seed portion ("seed") is comprised of a complete RAM memory that has "n" separate addressable locations and a limited amount of storage, usually one or two bits, per location. The seed also contains read/write circuits for these memory locations and ancillary support circuitry, such as address row decoders and true complement generators, used by the entire memory. Each stitch portion ("stitch") contains an identical number of RAM memory locations and the necessary read/write circuitry for these locations. As discussed in detail later, rowlines located within the seed and the stitch extend to the periphery (i.e. cell boundaries) of the seed and the stitch, respectively. Therefore, by positioning a stitch to the side of and horizontally contiguous to and vertically aligned with a seed, the rowlines of the stitch automatically connect to the rowlines of the seed in order to expand the number of memory locations present in any row. Here, stitch $50_1$, situated next to seed 40, provides additional locations for each row in seed 40. By placing other stitches, e.g. stitches $50_3$ and $50_2$, contiguous to previous stitches, e.g. stitches $50_2$ and $50_1$, respectively, the rowlines of the new stitches are vertically aligned with and joined to those of the previous positioned stitches, and thereby the number of locations present in each row is expanded. The number of separate addressable locations in both the seed and the stitch equals the number of separately addressable rows. To simplify the following discussion, the illustrative embodiments read and write a row of data at a time. However, in practice, well-known addressing circuitry can be easily incorporated into the memory in order to permit the memory to selectively read one or more desired bits from any row and/or selectively write one or more desired bits into any row.

Given the dimensions of the memory, the multi-layer metallization pattern (macro) for a seed and a stitch can be advantageously defined and then stored as separate macros in a computer, particularly that used as part of a computer aided design system. As will be discussed in greater detail shortly, the seed contains five basic circuits. The associated macros for these circuits are replicated and interconnected to form a seed of any desired size. In addition, the stitch contains three circuits. Their associated layout macros are also replicated and interconnected to form a stitch of any size. Consequently, by merely replicating and interconnecting macros, both the seed and the stitch can be easily customized to the size required by a particular embedded memory. This can be done using either an automated or even a manual layout process. Because each stitch, e.g. stitch $50_1$, used in any particular embedded memory, e.g. memory 30, is identical to the other stitches used in that memory, i.e. stitches $50_2$ and $50_3$, all the stitches merely need to be appropriately positioned to the right of the seed and contiguous to one another to form the desired memory. Hence, once defined for any particular memory, the entire layout of the stitch is itself replicated a particular number of times to form a memory of a desired size. Furthermore, the seed, e.g. seed 40, can be positioned in a variety of diverse locations on the masterslice, with the only limitation being the existence of a sufficient area to the right (and/or left) of the seed on the masterslice for accommodating the required number of stitches. As shown in FIG. 1, memory 30 can be easily expanded by positioning additional stitches outwardly to the right of the seed, i.e. in the direction of arrow 70, and/or by increasing the size of each seed and stitch in the direction of arrow 80.

By sizing the seed and stitch appropriately and by connecting only the minimally required number of stitches to a seed, the embedded memory will advantageously contain only the exact number of desired memory locations. In this manner, the embedded memory contains no unused locations and thereby consumes only a minimal amount of area on the masterslice. This, in turn, advantageously maximizes the area remaining on the masterslice for other circuitry. Moreover, since the embedded memory can be positioned anywhere on the masterslice, this advantageously imparts flexibility to the layout of masterslices.

Figures 2, 2A:
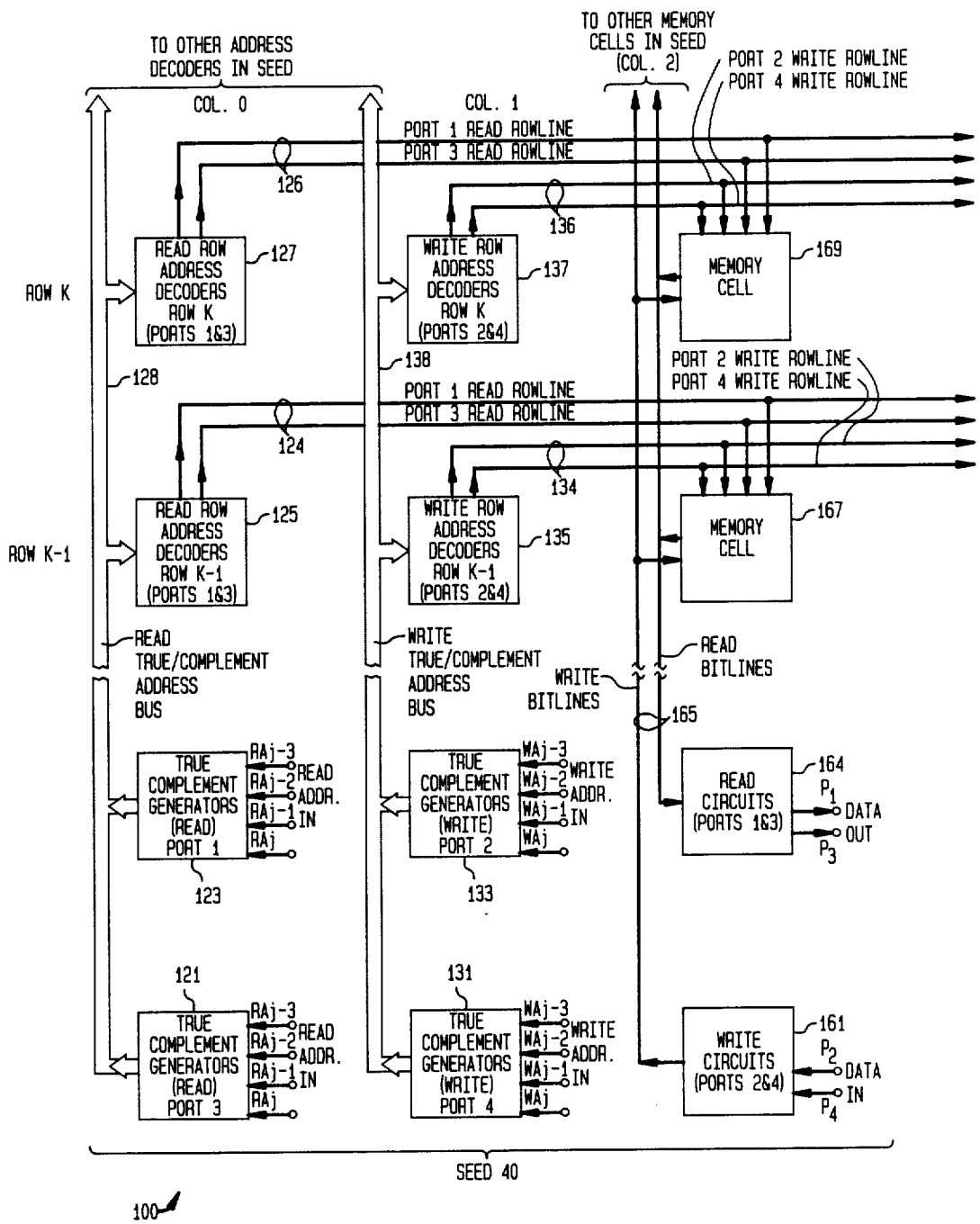
FIG. 2 shows the proper alignment of the drawing sheets for FIGS. 2A and 2B.
FIGS. 2A and 2B together depict a block diagram of one embodiment of memory 30 shown in FIG. 1.
Figure 2B:
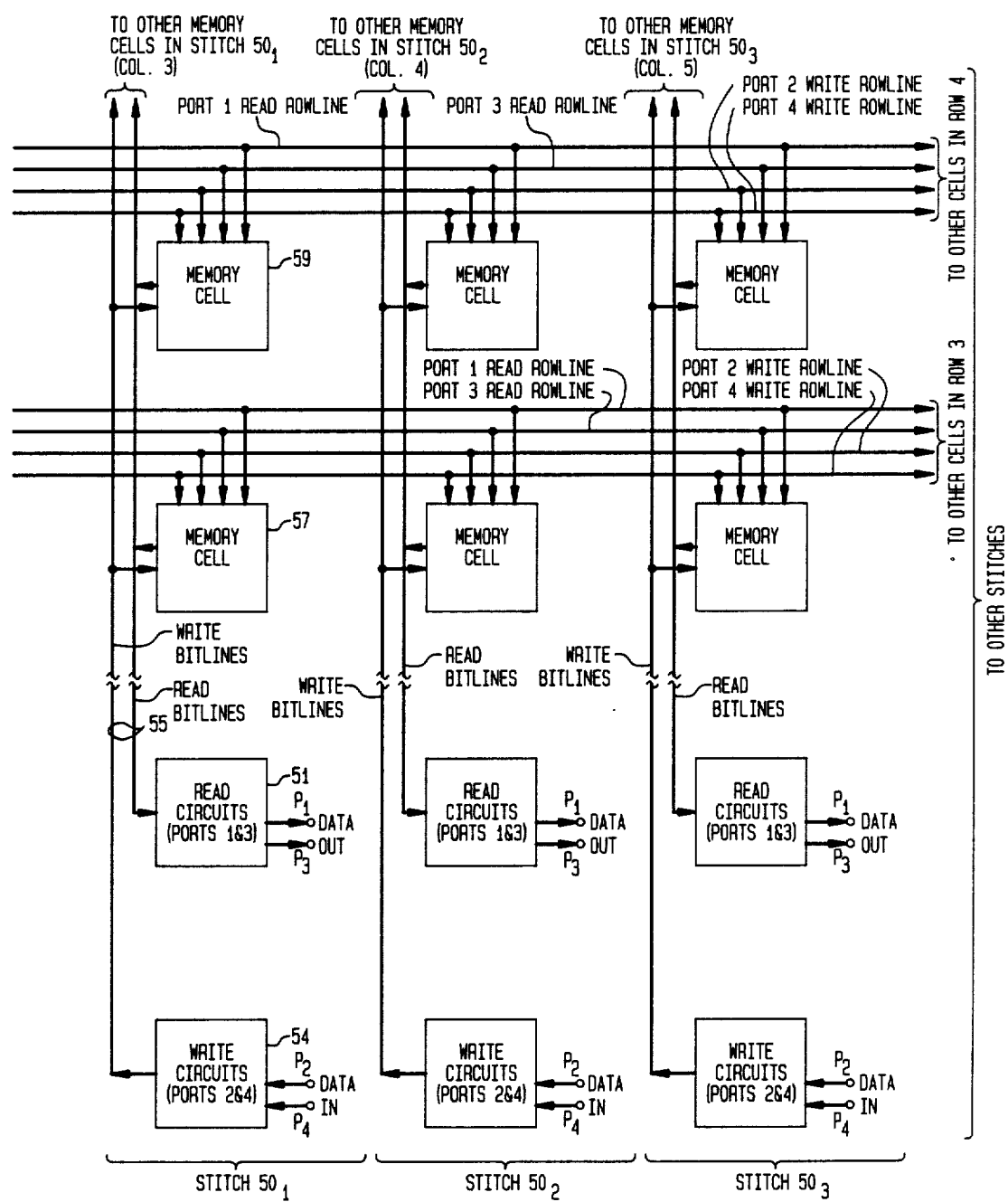

FIGS. 2A and 2B—for which the proper alignment of the drawing sheets is shown in FIG. 2—together depict a block diagram of a portion of embedded four port RAM memory 100 which embodies the principles of the present invention and which forms one embodiment of memory 30 shown in FIG. 1. Data stored in each location in this memory can be read through two separate read ports, i.e. ports 1 and 3 ($P_1$ and $P_3$), and data can be written into each location through two separate write ports, i.e. ports 2 and 4 ($P_2$ and $P_4$).

As discussed, the seed contains a small complete RAM memory along with ancillary support circuitry for the entire embedded memory, and each stitch contains additional memory locations and read/write circuitry for these additional locations. The memory locations in the seed and those in all the stitches form the storage array for the embedded memory. Seed 40 is connected to each row of three stitches, specifically stitches $50_1$, $50_2$ and $50_3$, by horizontally aligned read and write rowlines. A set of read and write rowlines exists for each row of memory locations and interconnects each of these locations with the appropriate address decoders in the seed. For simplicity, only rows K-1 and K of the memory array are shown (K is an integer less than or equal to the value "n"). As shown, read rowlines 124 and write rowlines 134 are both associated with row K-1. Read rowlines 126 and write rowlines 136 are both associated with row K. Additional stitches can be readily added to the memory by merely connecting them to all the read and write rowlines. All the rowlines carry control signals to each memory cell in a row to cause that cell to perform a specific operation, a read or write, involving a specific port, port 1 or 3 for a read, and port 2 or 4 for a write.

Within each column, data that has been read from a cell or data that is to be written into a cell is carried over read and write bitlines from read and write circuits (collectively referred to as data transfer circuits) located in that column. For example, bitlines 165 transfer data from and to all the cells that form column 2; likewise, bitlines 55 transfer data from and to all the cells that form column 3. For purposes of simplifying the figure, only one read bitline is shown for each column; however, in actuality, three read bitlines are used in each read circuit. Similarly, for purposes of simplifying the figure, only one column bitline is shown for each write although in actuality two driven write bitlines are used.

Seed 40 contains read row address decoders 125 and 127, write row address decoders 135 and 137, and true complement generators 121, 123, 131 and 133. To read data from a given row, an input read address, $RA_j$–$RA_{j-3}$, is first provided as input to true complement generators 121 and 123. These generators buffer this address and provide both non-inverted (true) and inverted (complement) address outputs. True complement generator 121 provides true/complement outputs for the input read address for port 3. True complement generator 123 provides true/complement outputs for the input read address for port 1. All these outputs form part of read true/complement address bus 128. Since each row carries a unique row address, selected address lines within bus 128 are connected to the inputs of each read now address decoder. Each read address row decoder, e.g. read row address decoder 125 and 127, generates row select control signals which are, in turn, applied over various read rowlines to each cell in the associated row, e.g rows K and K-1, respectively, to cause each cell to read its stored data and apply the resulting bit to a selected corresponding read port and, via the read bitlines, to the read circuits.

Alternatively, to write data into a given row, an input write address, $WA_j$–$WA_{j-3}$, is first provided as input to true complement generators 131 and 133. These generators buffer this address and provide both non-inverted (true) and inverted (complement) address outputs. True complement generator 131 provides true/complement outputs for the input write address for write port 4. True complement generator 133 provides true/complement outputs for the input write address for write port 2. All these outputs form part of write true/complement address bus 138. Since each row carries a unique row address, selected address lines within bus 138 are connected to the inputs of each write row address decoder. Each write address row decoder, e.g. write address row decoders 135 and 137, generates appropriate row select control signals which are, in turn, applied over various write rowlines to each cell in the associated row, e.g. rows K and K-1, respectively, to cause that cell to write data appearing on a selected corresponding write port and supplied over the write bitlines by the write circuits.

Within seed 40, all the address decoders contain identical circuitry. The only differences among particular address decoders are the bits each decoder accepts as input from a true/complement address bus and the particular rowline connected to the output of each decoder. Also, all the true complement generators contain identical circuitry. The only difference among the true complement generators is the particular bits that each true complement generator provides to the read or write true/complement address busses. All these differences are manifested as different connections in one or more metallization layers on the masterslice and, as such, are easy to implement. Furthermore, as discussed, each stitch contains identical circuitry and is connected in an identical fashion to the read and write rowlines.

The multi-layer metallization pattern defines each of the circuits used in the seed and stitch as well as providing the necessary interconnections therebetween. The metallization patterns for the address busses, and the read and write bitlines can exist on the same layer of the multi-layer metallization pattern. The metallization patterns for the read and write row lines can also occupy a common layer; however, this layer is usually different from that used by the bitlines.

The inventive method for generating custom size memories embedded in a masterslice can be readily automated with a computer aided design process. Owing to the identical nature (as discussed in detail later) of the actual circuitry of all the address decoders, the circuitry of all the true complement generators, the circuitry of all the memory locations and the circuitry of all the read circuits and that of the write circuits, pre-defined macros for each of these circuits can be stored in a computer. In this case, each circuit would have a number of standard sized pre-defined macros (e.g. separate macros for 2, 4, 8, and 16 input row address decoders) stored within the computer. The circuit designer would then pick the appropriate size macro for each circuit. Alternatively, given the size of the memory, the computer could even lay out and thereby define customized macros for each circuit used in the desired memory. In either case, i.e. whether a standard size macro is chosen or whether a customized macro is designed, the computer, given the size of the memory, can then calculate the number of each of these circuits that is necessary to implement the seed and a stitch. Thereafter, given a point of origin on the masterslice defined by an operator, the computer can retrieve the necessary macros, and, starting at the point of origin, position these macros on the masterslice to form all the circuits that together will comprise the seed. Once the macros for the individual circuits comprising the seed are positioned, the computer then ascertains the size and position of the true/complement address busses and the particular connections required thereto (e.g. the connections between any read address row decoder and the true/complement read address bus) and incorporates all these busses and connections into a metallization layer that forms part of the layout of the seed. In a similar fashion, since all the stitches are identical, the computer need only store macros for a memory cell, for the read circuits, and for the write circuits. Again, either standard size or custom designed macros could be used. Given the size of the memory, the computer calculates the number of these circuits that are necessary to fabricate a stitch having the proper number of separate rows and then appropriately positions their macros. The computer then successively replicates the entire layout of the stitch a sufficient number of times, to the side (typically the right side) of the layout of the seed in order to provide the desired number of columns. By replicating the entire layout of the stitch in successive columns to the side of the seed, all the rowlines running within the seed and in each stitch are vertically aligned. The rowlines within the macro of the seed and stitch extend to the periphery of the macro (i.e. a cell boundary) of the seed and stitch, respectively. Hence, once the seed and stitch macros are contiguously positioned and vertically aligned, the rowlines automatically join to connect the seed with each stitch and thereby, in turn, expand the memory.

Although the seed is illustratively shown as being three columns wide, the seed can be two columns wide on the masterslice for a single port RAM wherein the read and write rowlines are driven by a single row address decoder and each memory cell contains relatively few integrated elements.

Now, with the foregoing in mind, the ensuing discussion will now turn to the specific circuits used to implement both the seed and stitch. Reference will be made to a number of different voltage levels which are used to drive these circuits. These levels are illustratively and approximately: $+V$ equals 1.4 volts, $-V_1$ equals $-0.6$ volts, $-V_2$ equals $-2.2$ volts and $-V_3$ equals $-0.7$ volts. Many different levels other than these will also provide satisfactory operation.

Figure 3:
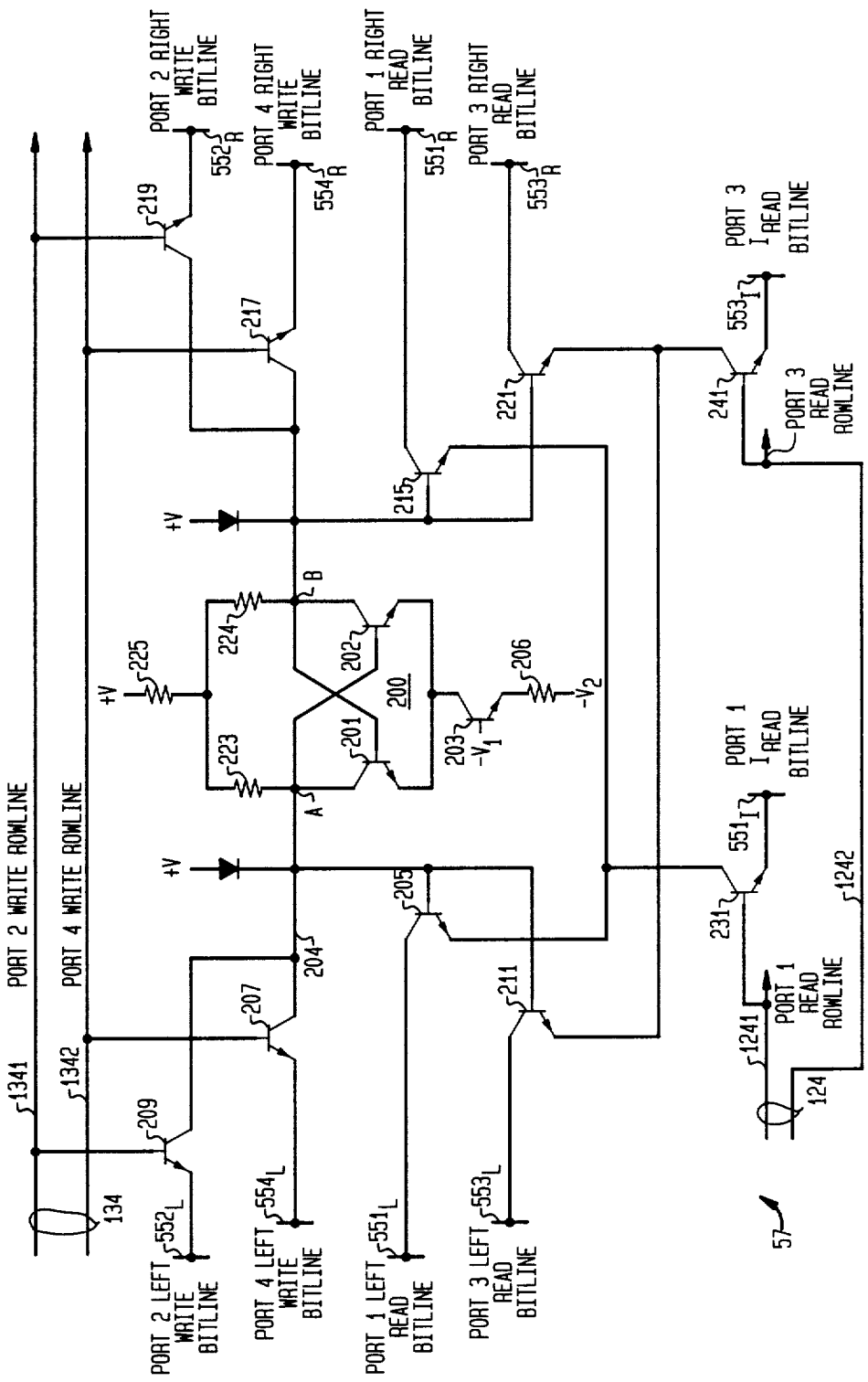
FIG. 3 is a schematic of a typical memory cell used in the embodiment of memory 30 shown in FIG. 2.

As noted, all the memory cells used in an embedded memory are identical. Hence, to simplify the following discussion, only one illustrative cell, i.e. memory cell 57, will now be discussed in detail. A schematic of that cell is shown in FIG. 3.

As discussed, data is provided to memory cell 57 through two separate write ports, i.e. ports 2 and 4, and stored data is read from the flip-flop through two separate read ports, i.e. ports 1 and 3. Read and write rowlines 124 and 134, which are both connected to memory cell 57, determine which one of the two read or write ports is used for any read or write operation. Data is transferrred to and from the memory cell via the write and read bitlines, collectively shown as bitlines 55 in FIG. 2, which comprise, as shown in FIG. 3, read bitlines 551 and 553 for ports 1 and 3, respectively, and write bitlines 552 and 554 for ports 2 and 4, respectively.

As shown, bistable flip-flop 200, comprised of transistors 201 and 202, lies at the center of this cell. This flip-flop stores one bit of data. If this bit is a "zero", then one of these two transistors, e.g. transistor 201, is conducting ("on") while the other transistor is non-conducting ("off"). Alternatively, if the stored bit is a "one" then the opposite occurs, i.e. transistor 202 is on while transistor 201 is off. To set this flip-flop to a particular state, current is diverted away from a collector of either transistor 201 or 202 and sunk through a particular bitline, as described below. For example, if a "zero" is to be written into the flip-flop through write port 2, then a row select signal on write rowline 1341 supplies base drive current to transistor 209 which turns that transistor on. If transistor 201 was initially off, its collector voltage would be high. However, once transistor 209 starts conducting, this transistor pulls current out of node "A" and routes this current to port 2 left write bitline 552$_L$. As a result, the voltage at node "A" decreases. This, in turn, causes the voltage at the base of transistor 202 to decrease which turns this transistor off. The voltage at the collector of transistor 202, i.e. the voltage appearing at node "B", increases which, applied to the base of transistor 201, causes that later transistor to turn on and thereby store a "zero" within the flip-flop. This logic state continues until flip-flop 200 is set into the "one" state. A "zero" can also be written into the flip-flop using write port 4 which, when selected, turns transistor 207 on. In a similar fashion, a "one" can be stored into flip-flop 200 by pulling current from node "B" rather than from node "A$_1$". This is accomplished by turning either transistors 217 or 219 on via row select signals applied to port 2 write rowline 1341 or to port 4 write rowline 1342. Current is pulled from only one of the nodes, i.e. node "A" or node "B" but not both, whenever data is being written into the flip-flop. Collector current for flip-flop 200 flows from the $+V$ supply, through resistor 225 and collector resistors 223 and 224, and through a current sink, comprised of transistor 203 and resistor 206, to the $-V_2$ supply. Supply $-V_1$ sets the amount of current flowing through this current sink.

As noted, data can be written into the flip-flop using either one of two write ports, i.e. write port 2 or 4. Depending upon the state of this data, only one of four transistors, i.e. transistors 207, 209, 217 or 219, will conduct with its emitter current being sunk through only one of four respective bitlines 554$_L$, 552$_L$, 554$_R$ or 552$_R$. As noted, an appropriate row select signal is applied to the rowline for the desired port: rowline 1341 for write port 2 and rowline 1342 for write port 4. By doing so, the two transistors connected to that rowline have their bases driven positively. For example, if rowline 1341 is selected, then the bases of transistors 209 and 219 are both driven positively. Then, depending upon the data to be written into the flip-flop through write port 2, either port 2 left write bitline 552$_L$ or port 2 right write bitline 552$_R$ is allowed to sink current. If a "zero" is to be written, then bitline 552$_L$ is pulled low by the write circuit (discussed in detail in conjunction with FIG. 5) connected to this bitline. This causes transistor 209 to conduct and have its emitter current sunk through this bitline. By contrast, the write circuit does not permit bitline 552$_R$ to sink current and, as such, this bitline remains at a high potential. Hence, although the base of transistor 219 is driven by the row select signal present on rowline 1341, the emitter of this transistor remains at a high level and, as such, transistor 219 does not conduct. Rowline 1342, transistors 207 and 217 and bitlines 554$_L$ and 554$_R$ operate in a similar fashion to write data into the flip-flop through port 4.

To read data from flip-flop 200, an appropriate control signal is placed by read row address decoder 125 (see FIG. 2A) onto the selected read rowline for the desired port. For example, to read data through port 1, a control signal is applied to port 1 read rowline 1241, as shown in FIG. 3. This signal causes transistor 231 to conduct and thereby sink emitter current through port 1 read current bitline 551$_I$. This read current bitline is connected to a current sink (see FIG. 4) situated within read circuits 51 (see FIG. 2B). The same applies for read current bitline 553$_I$. With transistor 231 conducting, current flows through the emitter of transistor 205 or transistor 215, shown in FIG. 3, depending upon which of these two transistors is on. The bases of these two transistor are connected to the collectors of transistors 201 and 202, both located within flip-flop 200. Consequently, the state of flip-flop 200, and particularly the voltages appearing at the collectors of transistors 201 and 202, determine whether transistor 205 or transistor 215 conducts. Thus transistors 205 and 215, in turn, permit current to be sunk from one of the bitlines for read port 1, i.e. bitlines 551$_L$ or 551$_R$, depending upon the data stored within the flip-flop. As discussed in detail later and in conjunction with FIG. 4, the current flowing through these read bitlines is applied to read circuits 51 (see FIG. 2B) which, in turn, generate a differential voltage therefrom that is detected by an appropriate sense amplifier located therein to produce the proper data output level.

Specifically, if a "zero" is stored within the flip-flop 200, shown in FIG. 3, then transistor 201 is on. Its collector voltage is low thereby turning transistor 205 off. At the same time, transistor 202 is off. Its collector voltage is high, thereby turning transistor 215 on. Hence, the voltages present at the collectors of both transistors 201 and 202 cause transistor 215 to conduct and maintain transistor 205 in a non-conductive state. As a result, current flows from read port 1 right read bitline $551_R$ and through transistor 215; while no current flows through port 1 left read bitline $551_L$. In a similar manner, to read data stored within flip-flop 200, via read port 3, then an appropriate row select signal is applied, by read row address decoder 125, to port 3 read rowline 1242 instead of to port 1 read rowline 1241. This, in turn, by virtue of the state of flip-flop 200, causes transistor 211 or transistor 221 to conduct and thereby route current from one of the port 3 read bitlines $553_L$ or $553_R$, through transistor 241 and via port 3 read current bitline $553_I$, to read circuits 51.

As evident from FIG. 3, all control signals, i.e. the read and write rowlines, drive transistor bases. A transistor base generally requires very little drive current. Thus, many such bases can be connected to one of the rowlines and be adequately driven by the current supplied through a single drive transistor connected thereto, e.g. drive transistor 751 located within read address row decoder $125_{P1}$—shown in FIG. 7 and discussed later—and which drives port 1 read rowline 1241. Therefore, many cells can be spaced a relatively great distance away from the row decoders located in the seed without suffering any significant performance degradation resulting from the separation. Consequently, base driven rowlines advantageously permit relatively large memory arrays to be readily fabricated using the inventive method.

Figure 4:
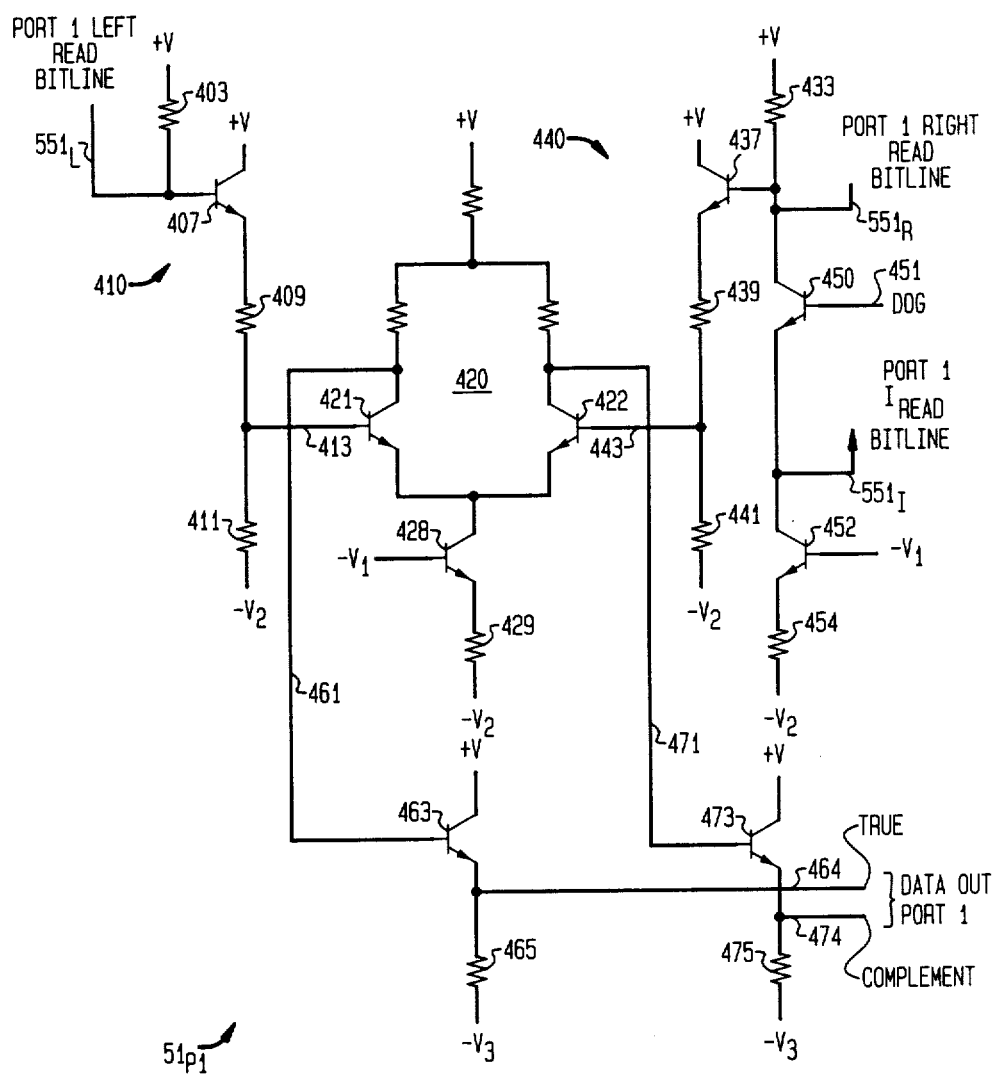
FIG. 4 is a schematic of a typical read circuit used in the embodiment of memory 30 shown in FIG. 2.

FIG. 4 shows one of two identical read circuits that together comprise read circuits 51. One such circuit is connected to the left and right read bitlines and to the $I_{read}$ bitline for each read port. Specifically, one circuit is connected to port 1 read bitlines $551_L$ and $551_R$ and to $I_{read}$ bitline $551_I$, while another such circuit is connected to port 3 read bitlines $553_R$ and $553_L$ and to $I_{read}$ bitline $553_I$. Each of these two read circuits functions independently of each other. For purposes of simplifying the drawing and the ensuing discussion, only one such read circuit, particularly read circuit $51_{P1}$ used for read port 1, is shown in this figure and discussed below. The other read circuit functions in an identical manner.

Differential sense amplifier 420 forms the basis of read circuit $51_{P1}$. This sense amplifier is powered through a constant current sink comprised of transistor 428 and resistor 429. By virtue of the gain of transistors 421 and 422 and the constant emitter drive current shared by these transistors, the sense amplifier produces a relatively large differential output voltage across the collectors of transistors 421 and 422 in response to any differential change in their respective base voltages. The current flowing on the port 1 read bitlines is converted to a voltage by current-to-voltage converters 410 and 440 which provide differential output voltages over leads 413 and 443, as input signals, to the bases of transistors 421 and 422 located within sense amplifier 420. The differential outputs of the sense amplifier, appearing at the collectors of transistors 421 and 422, are buffered by common emitter driver transistors 463 and 473. The outputs of these driver transistors are applied, using pull-down resistors 465 and 475, respectively, to true data output 464 and complement data output 474, which together provide the data output for read circuit $51_{P1}$ and thereby the port 1 data output for read circuit 51, shown in FIG. 2. If a single ended output is desired, then, depending upon the desired polarity of the data output signal, either true data output 464 or complement data output 474 is used as the output.

To understand the operation of this circuit $51_{P1}$ shown in FIG. 4, first assume that port 1 left read bitline $551_L$ does not conduct current; while port 1 right read bitline $551_R$ does. This condition corresponds to a "zero" stored within flip-flop 200, as previously discussed. In this case, the voltage appearing at the base of transistor 407 is high owing to pull-up resistor 403 which pulls the voltage appearing on left read bitline $551_L$ up. Consequently, a relatively high positive voltage appears at base of transistor 407. Transistor 407 is always on by virtue of the bias current supplied to its base by resistor 403. Hence,, the emitter voltage of this transistor follows and remains at 0.8 volts below its base voltage. Thus, the voltage appearing on lead 413, at the connection between resistors 409 and 411, became more positive which, in turn, increased the base drive for transistor 421 located within sense amplifier 420. As a result, the collector voltage of this transistor, appearing on lead 461, decreased positively thereby reducing the base voltage for drive transistor 463. Thus, the voltage appearing at the emitter of this drive transistor and hence on true data output lead 464 has increased negatively.

At the same time, port 1 right read bitline $551_R$ conducts current. As such, the voltage appearing on this bitline will be low. Transistor 437—like transistor 407—is always on by virtue of the bias current supplied to its base by resistor 433. Hence, the emitter voltage of this transistor follows and remains at 0.8 volts below its base voltage. Thus, with the voltage on the bitline low and with the emitter of transistor 437 0.8 volts less than that appearing on the bitline, then the voltage appearing on lead 443, at the connection of resistors 439 and 441, has decreased negatively. As a result, the base voltage for transistor 422 decreased negatively which, in turn, caused its collector voltage to increase positively. This collector voltage, appearing over lead 471, causes drive transistor 473 to conduct. As a result, the voltage present at the emitter of drive transistor 473, i.e. the complement data output voltage, also increased positively, indicative of a "zero", as discussed above, being stored within memory cell 57 (see FIG. 2).

A constant current sink comprised of transistor 452 and resistor 454 sinks current from the port 1 read current bitline $551_I$.

Transistor 450 is advantageously used to disable all activity involving read port 1 for stitch$_1$. This permits the read ports in any stitch to be selectively disabled and later enabled, as needed, thereby enhancing the testability of large memory arrays. In particular, whenever a high level control signal is applied to the data out gate (DOG) input of read circuit $51_{P1}$, the base voltage of transistor 450 increases positively which, in turn, causes this transistor to turn on. As a result, the voltage present at the base of transistor 437 decreases positively which, in turn, causes its emitter voltage to decrease by the same amount. This, in turn, forces transistor 422, located within sense amplifier 420, to become less conductive. As a result, the complement data output voltage, appearing on lead 474, increases positively thereby placing the complement output of read circuit $51_{P1}$ into a logical "one" state. Simultaneously therewith and by virtue of transistor 450 being on, the voltage present on port 1 read current bitline $551_I$ increases positively. The magnitude of this voltage is sufficiently high to force transistor 231 (see FIG. 3) to remain off, regardless of the level of the control signal applied to port 1 read rowline 1241. This, in turn, extinguishes the emitter current for transistors 205 and 215 which are both connected to read port 1 and thereby prevents both transistors from switching. Read port 1 is enabled by applying a low level voltage to DOG input 451, shown in FIG. 4 to force transistor 450 off. This allows port 1 read current bitline $551_I$ to assume its normal negative voltage value and thereby sink current $I_{read}$ from the cell.

Figure 5:
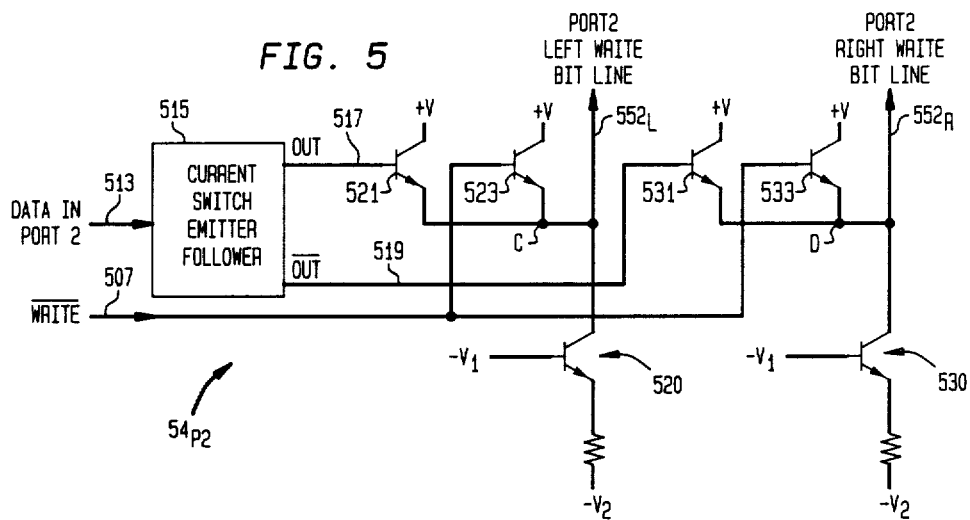
FIG. 5 is a schematic of a typical write circuit used in the embodiment of memory 30 shown in FIG. 2.

FIG. 5 shows one of two identical write circuits that together comprise write circuits 54. One such circuit is connected to the right and left write bitlines for each write port. Specifically, one circuit is connected to port 2 write bitlines $552_L$ and $552_R$; while another such circuit is connected to port 4 write bitlines $554_R$ and $554_L$. Each of these two write circuits functions independently of the other. For purposes of simplifying the drawing and the ensuing discussion, only one such write circuit, particularly write circuit $54_{P2}$ used for write port 2, is shown in this figure and discussed below. The other write circuit functions in an identical manner.

Here, as shown, input data is applied, via lead 513, to well-known current switch emitter follower circuit 515. This current switch emitter follower circuit essentially comprises a current switch and two output emitter follower drivers. One driver produces the buffered input bit on lead "OUT", and the other driver produces the complement of this bit on lead "not OUT". Transistors 521 and 523, and transistors 531 and 533 form two current steering networks. Consider for the moment, the network associated with port 2 left write bit line $552_L$, i.e. transistors 521 and 523. The emitter of these two transistors along with the emitter of transistor 209 (see FIG. 3), wired through bitline $552_L$, are all interconnected. Current sink 520 shown in FIG. 5, sinks a constant amount of current which will flow through whichever one of these three transistors has the highest base voltage. The other current steering network, comprised of transistors 531 and 533, along with transistor 219 (see FIG. 3), which is connected to right write bitline $552_R$, function in a similar manner to that described above. Write circuit $54_{P2}$ shown in FIG. 5 provides three states of operation: depending upon the data to be written into the cell, current is sunk either through left write bitline $552_L$ or through right write bitline $552_R$, or in the event no data is to be written, i.e. the control signal on write control lead 507 is high, neither bitline sinks current.

Specifically, to write a "zero" into memory cell 57, current must flow from port 2 left write bitline $552_L$ through current sink 520 and no current must flow through port 2 right write bitline $552_R$. In this case, a low logic level is applied to lead 513. This, by virtue of current switch emitter follower circuit 515, causes a low level to appear on lead 517 and a high level to appear on lead 519. To write this data, a low level is also simultaneously applied to write control lead 507. The low levels appearing on leads 507 and 517 force transistors 521 and 523 into a non-conductive state. Current sink 520, set by the application of voltage $-V_1$, sinks a certain amount of current. With both transistors 521 and 523 off, current will be routed through left write bitline $552_L$ and from there will be sunk by current sink 520. Now, if either the control signal appearing on write control lead 507 or the input data appearing on lead 513 becomes high (a "one"), then either transistor 521 or 523 will conduct, thereby supplying all the current to current sink 520 and effectively preventing any current from flowing on left write bitline $552_L$. Hence, transistors 521 or 523 operate to gate current from either the $+V$ supply or from left write bitline $552_L$ into current sink 520. The voltage at the base of either of these two transistors is either approximately $-0.4$ volts when the transistor is turned off or approximately $+0.4$ volts whenever that transistor is turned on. Transistors 531 and 533 operate in the same manner, as do transistors 521 and 523, to enable current to flow through write bitline $552_R$ to current sink 530 whenever a "one" is to be written into memory cell 57 and a low level control signal is simultaneously applied to write control lead 507.

Figure 6:
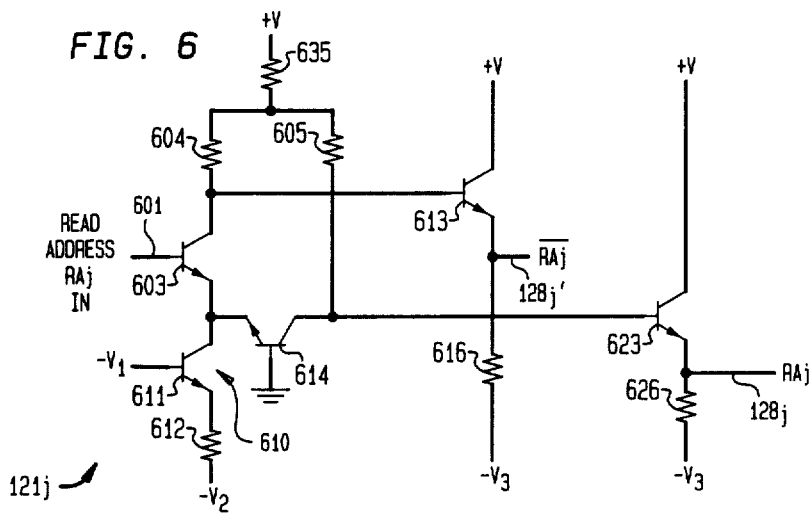
FIG. 6 is a schematic of the circuit of a typical true complement generator used in the embodiment of memory 30 shown in FIG. 2.

FIG. 6 shows a schematic of a true complement generator. Inasmuch as all the true complement generators are identical, FIG. 6 illustratively shows only the schematic of a true complement generator which forms part of read true complement generators 121 and,, more particularly, true complement generator $121_j$ which is associated with most significant read address bit j, i.e. bit $RA_j$, and the ensuing discussion will be so limited.

If read address bit, $RA_j$, is high, then the voltage applied to complement address lead $128_j'$ is low and that applied to true address lead $128_j$ is high. Specifically, with a high level input voltage applied over lead 601, transistor 603 conducts current and its emitter voltage changes in a positive direction. As such, the emitter-base junction of transistor 614 becomes insufficiently forward-biased and no current flows through the entire transistor. The emitter current flowing through transistor 603 flows through constant current sink 610 comprised of transistor 611 and resistor 612. With transistor 603 conducting, its collector voltage decreases by approximately 0.8 volts to a level, approximately 0.4 volts, that significantly lowers the base drive of transistor 613. As a result, the emitter voltage of drive transistor 613 is pulled negative by pull-down resistor 616. The emitter voltage is applied to complement read address lead $128_j'$ true/complement address bus 128. Also, with transistor 614 off (non-conductive), its collector voltage is pulled positive by resistor 605 to a level (approximately 1.2 volts) which significantly increases the base drive of transistor 623. As such, its emitter voltage rises in a positive direction. This emitter voltage is applied to true read address lead $128_j$ of read true/complement address bus 128. Transistors 613 and 623 are always conducting and merely change the value of the current flowing therethrough in order to increase the switching speed of the overall circuit.

Alternatively, if the input to true complement generator $121_j$ is low, then the voltage applied to complement address lead $128_j'$ is high and that applied to the true address lead $128_j$ is low. Specifically, with the input voltage on lead 601 low, transistor 603 is off. The voltage at the emitter of this transistor falls to a negative value sufficient to turn transistor 614 on. Thus, current flows through transistor 614 to current sink 610. The collector voltage of non-conducting transistor 603 is pulled positive by resistor 604. This, in turn, significantly increases the base drive of transistor 613 and causes the voltage applied to complement read address lead 128$_j'$ to rise in a positive direction. Inasmuch as transistor 614 is conducting, its collector voltage decreases to a value which significantly lowers the base drive of transistor 623 which, in turn, causes the voltage applied to true read address lead 128$_j$ to be pulled negative by pull-down resistor 626. Resistor 635 lowers the up-level of both the true and complement signals appearing on leads 128$_j$ and 128$_j'$ of the true/complement read address bus to approximately 0.4 volts. This reduces the swing of the address signals for read address bit RA$_j$ to ±0.4 volts and thereby increases the switching speed of the circuit.

Figure 7:
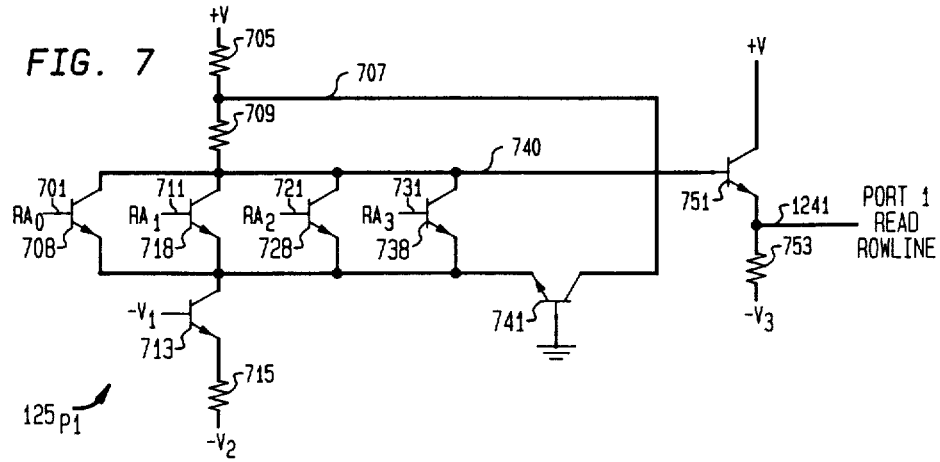
FIG. 7 is a schematic of a typical row address decoder circuit used in the embodiment of memory 30 shown in FIG. 2.
Figure 8B:
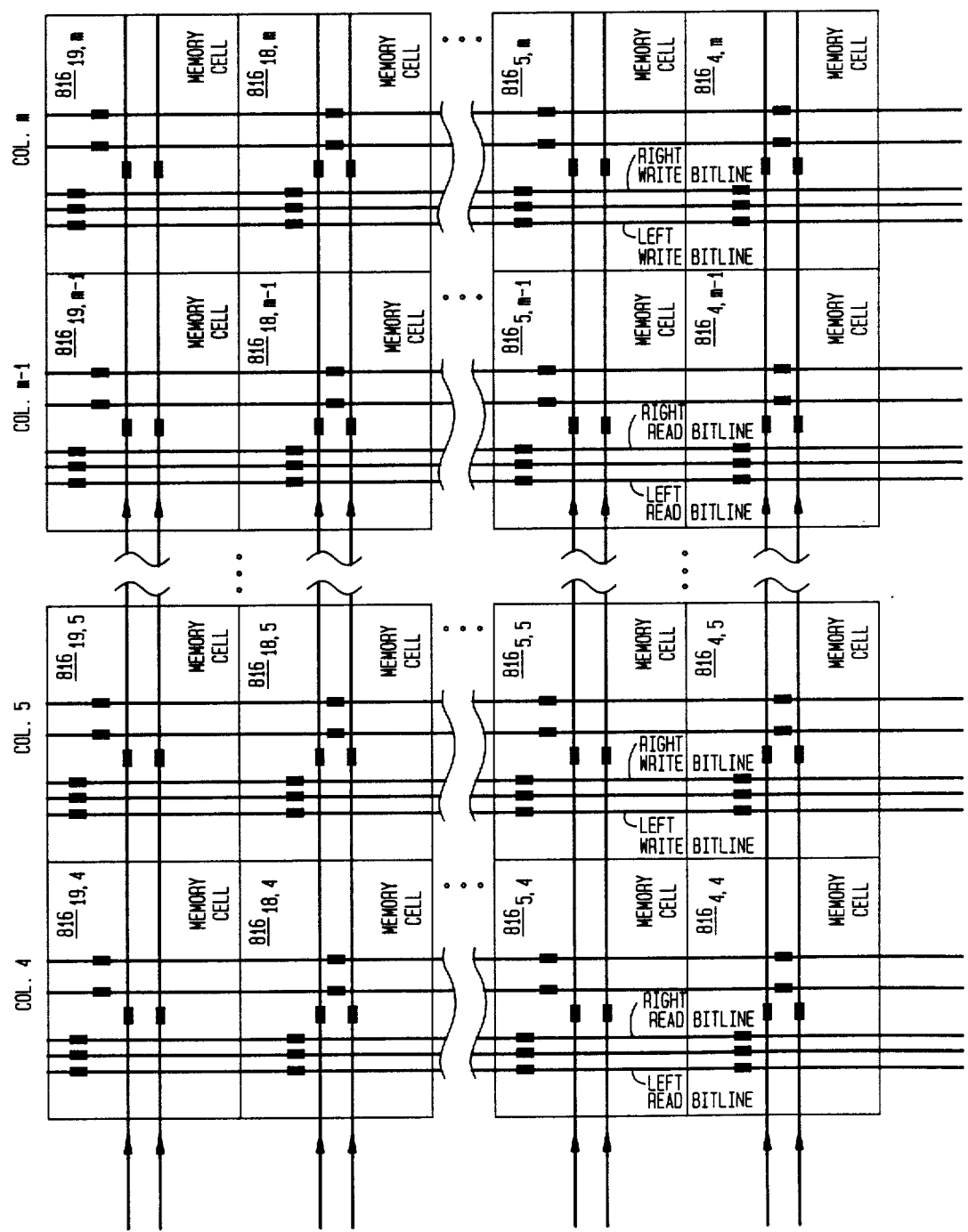
Figure 8C:
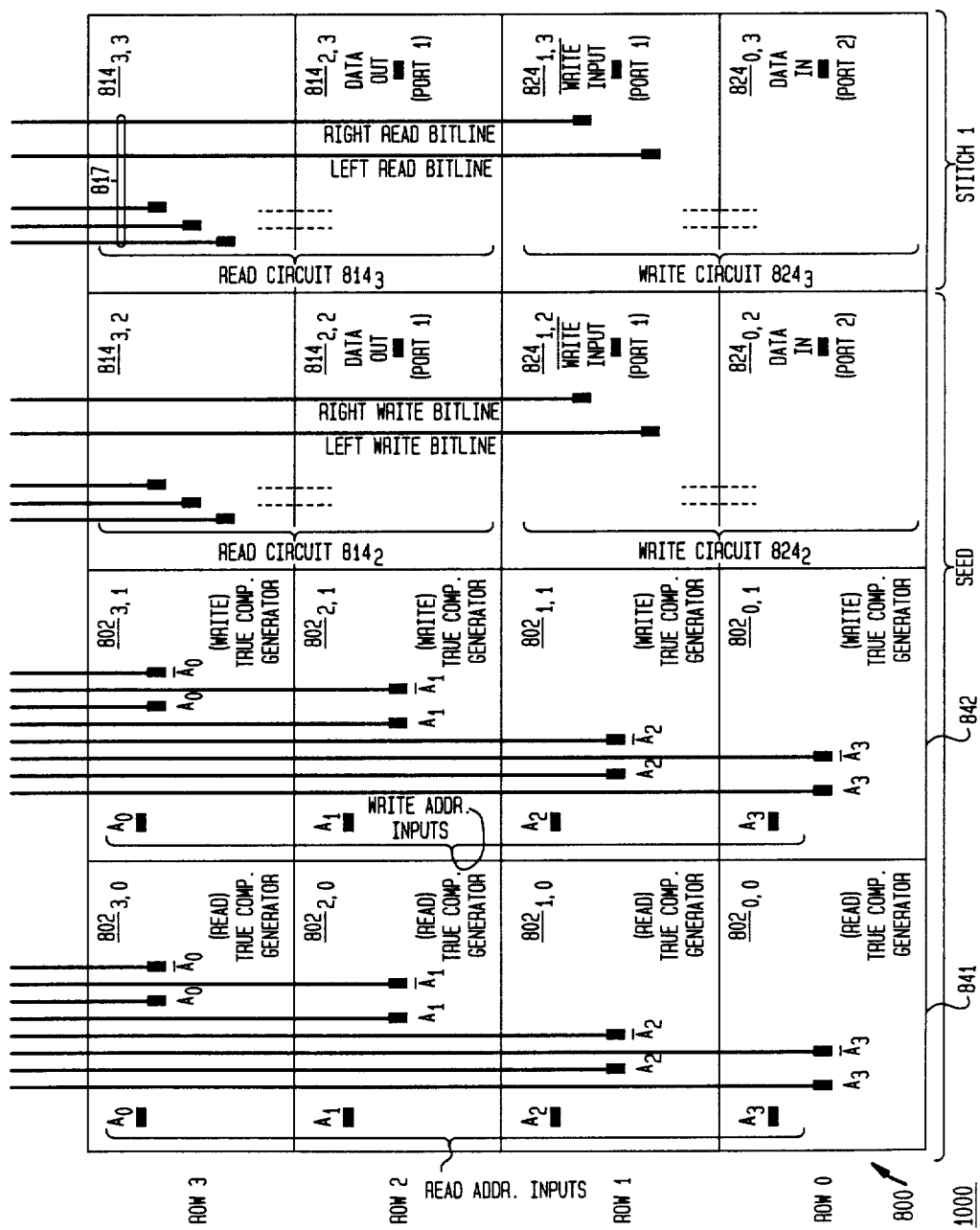
Figure 8D:
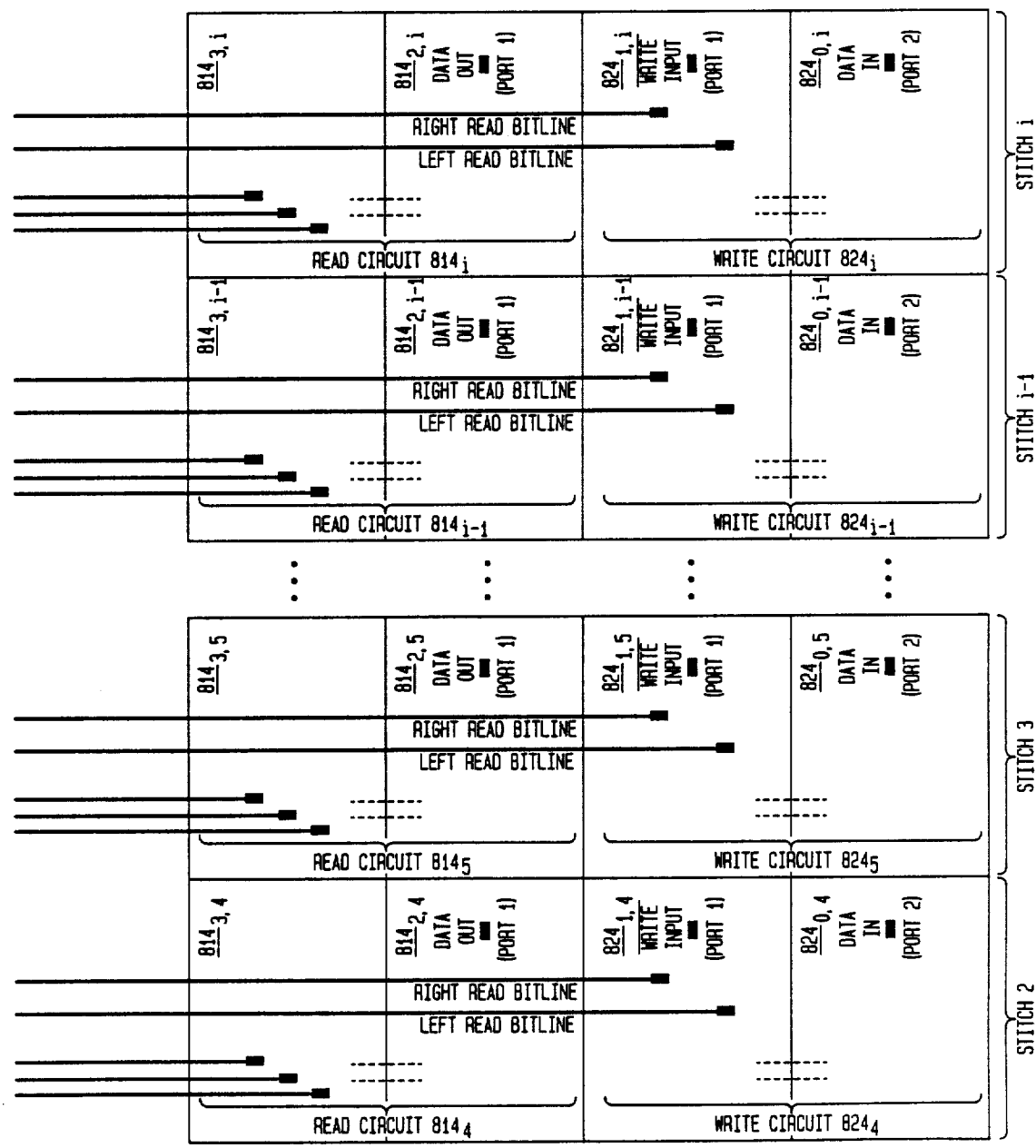

FIG. 7 shows a schematic of one of the row address decoder circuits. Inasmuch as all the row address decoders, including both the read and write row address decoders, are identical, FIG. 7 illustratively shows only the decoder which forms part of read row address decoders 125 and, more particularly, read row address decoder 125$_{P1}$ which generates port 1 read rowline 1241 (see FIG. 3). The following discussion will be limited to this decoder.

This decoder is responsive to a particular four bit address appearing on read true/complement address bus 128 (see FIG. 2A). In particular, decoder 125$_{P1}$ shown in FIG. 7 contains a four transistor NOR gate comprised of transistors 708, 718, 728 and 738. The base of each of these transistors is interconnected, through a corresponding one of leads 701, 711, 721 or 731, to a particular address lead appearing on this bus. The collectors of transistors 708, 718, 728 and 738 are connected together, via lead 740, and will only be at a high level if all these transistors are off, i.e. the signals at the bases of all these transistors are low. Decoder 125$_{P1}$ responds to the address for row 0 which is "0000". Hence, for this address, the bases of these transistors are wired to the true leads for address bits 0000, i.e. leads RA$_0$, RA$_1$, RA$_2$ and RA$_3$. If, on the other hand, this decoder were to respond to address "1111", then the bases of these four transistors would be wired to the complement leads for these four address bits. The output of the NOR gate appearing on lead 740 is applied to the base of drive transistor 751. The voltage at the emitter of this transistor, and hence on port 1 read rowline 1241, will only become high whenever the proper address is present at the four address inputs to decoder 125$_{P1}$; the voltage on this read rowline will be low for all other addresses applied as input to this decoder. Transistor 713 and resistor 715 provide a constant current sink. Transistor 741 provides an alternate path for current to flow whenever transistors 708, 718, 728 and 738 are all off. Furthermore, transistor 741 is connected as a well-known reference level—(here ground) the same configuration is also used in the true complement generator—to advantageously impart a sharp switching transition between the input logic levels and thereby increase the input noise margin of the circuit. Resistor 705 decreases both the up and down levels and hence lowers the swing of the select signal appearing on rowline 1241. For write decoders 135, the lower rowline voltage swing ensures proper functioning of the write circuit connected through various transistors, as previously described, to this rowline.

Now, after having described how a custom sized embedded memory can be easily designed using the inventive seed and stitch method and the particular circuits used to implement the embedded memory, FIGS. 8A-8D depict a layout of a two port 16 by m location random access memory 800 embedded in masterslice 1000 and constructed in accordance with this method. The proper layout of the drawing sheets for these figures is shown in FIG. 8. For purposes of simplifying the depicted layout, memory 800 is only shown as a two port memory, i.e. with one read port, Port 1, and one write port, Port 2. Nonetheless, with the foregoing description in mind, those skilled in the art will readily appreciate that by adding additional read and write rowlines and associated support circuitry; such as decoders, true complement generators, and read and write circuits, the memory shown in these figures can be easily expanded to include additional read and/or write ports.

Specifically, as discussed above, a masterslice, particularly masterslice 1000, includes an array of identical cells. A portion of such an array is shown in FIGS. 8A-8D with each cell represented as a rectangular box, such as cells 841 and 842. For the two port memory shown here, the seed occupies the first three columns of the entire array, with each stitch occupying a single column. There is only one seed and "i" stitches. For the two-port memory shown here with "m" locations in any row, "i" would equal the value "m−1". Multi-layer metallization patterns applied over the circuitry existing in each cell customize the circuitry therein to form the specific circuits, as described above, used in the seed and stitch. As discussed later, FIGS. 8A-8D also show metallization traces used for various leads, such as the read and write true/complement address busses, the read and write rowlines, and the read and write bitlines, which together interconnect the cells in order to form the embedded memory.

The seed contains a complete 16 row by 1 bit memory and all the ancillary decoding circuitry used by memory 800. This decoding circuitry comprises the true complement generators and the address decoders. As shown, all the true complement generators—i.e. true complement generators 802$_{0,0}$, 802$_{1,0}$, 802$_{2,0}$ and 802$_{3,0}$ for column 0 and 802$_{0,1}$, 802$_{1,1}$, 802$_{2,1}$, and 802$_{3,1}$ for column 1—and all the address decoders—i.e. read address row decoders 810$_{4,0}$, 810$_{5,0}$, . . . , 810$_{18,0}$ and 810$_{19,0}$ for column 0 and write address row decoders 810$_{4,1}$, 810$_{5,1}$, . . . , 810$_{18,1}$ and 810$_{19,1}$ for column 1—are implemented in the first two columns of the array and particularly in the two leftmost columns of the seed. Read true/complement address bus 803 and write true/complement address bus 805 are implemented by vertically oriented metallization traces which are situated directly above these cells. The remaining column of cells in the seed, i.e. column 2, forms the first column of identical memory cells and contains memory cells 816$_{4,2}$, 816$_{5,2}$, . . . , 816$_{18,2}$ and 816$_{19,2}$. This column of the seed also contains read and write circuits 814$_2$ and 824$_2$, respectively for these memory cells. Owing to the relatively large amount of circuitry that comprises the read and write circuits, the read and write circuits are each implemented on two vertically adjacent cells of the masterslice as shown. For example, read circuit 814$_2$ in column 2 stretches across cells 814$_{2,2}$ and 814$_{3,2}$, and write circuit 824$_2$ stretches across cells 824$_{0,2}$ and 824$_{1,2}$. The two short dashed lines which connect the two cells that comprise either a read or a write circuit indicate that internal signals used within these circuits cross over respective cell boundaries.

As previously described, each of the "i" stitches is identical, and, for that reason, only stitch$_1$ will be described. As shown, stitch$_1$ contains one column of cells which is interconnected, by appropriate multi-layer metallization patterns, to form a column of 16 memory locations. In particular, stitch$_1$ contains identical memory cells $816_{4,3}$, $816_{5,3}$, ..., $816_{18,3}$ and $816_{19,3}$. This stitch also contains read and write circuits $814_3$ and $824_3$, respectively to support these memory cells. The read and write circuits, as in the seed, span two vertically adjacent cells. Specifically, read circuit $814_3$ spans cells $814_{3,3}$ and $814_{2,3}$, and write circuit $824_3$ spans cells $824_{1,3}$ and $824_{0,3}$. As shown, the metallization traces for the bitlines (the left and right read and write bitlines and the $I_{read}$ bitline), illustratively traces 817, lie directly above the cells in stitch$_1$ and interconnect the memory cells therein with the appropriate read/write circuits located within this stitch. The traces for the read and write rowlines, i.e. traces $815_4$, $815_5$, ..., $815_{18}$ and $815_{19}$ lie directly above each row of memory cells and extend horizontally across the width of stitch$_1$.

Now, as one can clearly appreciate from FIGS. 8A–8D, the layout of the metallization patterns for the busses, rowlines and bitlines readily permits the embedded memory to be easily designed for any size by a circuit designer using either a manual or a computer aided design process. In particular, and as shown, each stitch uses the same layout of metallization patterns. As such, successive identical stitches merely need to be positioned side by side. As noted, the rowlines extend to the periphery of the seed and each stitch. Hence, once each stitch is positioned contiguous to and vertically aligned with a seed or a previously positioned stitch, the rowlines in the seed and all the stitches automatically join thereby connecting all the stitches together to the row address decoders in the seed. Moreover, as discussed, all the memory cells that comprise a stitch are identical. The metallization traces for the bitlines for each memory cell extend slightly beyond the cell boundary. Hence, once memory cells in a stitch are positioned contiguous to and in a vertical column (i.e. horizontally aligned), their bitlines automatically join to interconnect these cells to the read/write circuits in the stitch and thereby increase the number of rows in that stitch. Likewise, the memory cells in the seed are also identical to those in the stitch and are merely replicated vertically and also have their the metallization traces for their bitlines interconnected therebetween to increase the number of addressable rows of memory located in the seed.

The number of address leads which form the read and write true/complement address busses depends upon the size of the address applied to the memory. As the size of the address increases, additional address leads must be incorporated into the true/complement address busses. As such, an additional number of true complement generators would be needed to drive the additional true/complement address leads used in these busses. Also, an additional number of row address decoders would be needed to fully decode these addresses. Moreover, each decoder would need to respond to a larger number of address bits.

Consequently, to design an embedded memory of a desired size using the inventive seed/stitch method in conjunction with a computer aided design system, the macro for each basic circuit, i.e. an address decoder, a true complement generator, a read circuit, a write circuit and a memory cell, would first be defined. Given a origin on the masterslice, these macros are then replicated a sufficient number of times and appropriately positioned to generate the layouts of the seed and the stitch. Then, given the number of rows in the memory, the metallization patterns for the row address busses are then laid out over the seed. Thereafter, the first stitch is placed to the right of the seed. Then, the entire layout of the stitch is itself replicated and each additional stitch is successively positioned to the right of each previous stitch until the layout patterns for the entire memory have been defined.

As noted, several different sized macros for each basic circuit (e.g. separate macros for 2, 4, 8, ad 16 bit input address decoders) could be pre-defined and stored for future use in lieu of custom designing each macro for every memory. In this manner, the circuit designer could implement his design using only these standard sized macros. Although this technique may yield a memory that is larger than minimally necessary, this technique greatly simplifies the processing required by the computer aided design system used by the circuit designer.

Although, for the embodiments described above, a stitch has been shown and described as being positioned to the right of the seed, a stitch can, in fact, be positioned on either side of the seed, i.e. to its right or left. In addition, although the seed and stitches have been shown as being vertically aligned, i.e. situated in separate columns, the macros of the seed and stitch can be changed to permit stitches to be positioned above and/or below the seed in lieu of being positioned only to the side of the seed. Furthermore, although the column of row address decoders and the column of memory cells that together comprise the seed have been shown as being contiguous, these columns can alternatively be separated with one or more stitches, or other circuits, positioned therebetween. In this manner, the non-memory circuitry connected to any stitch can be physically located close to the stitch thereby simplifying the interconnections and reducing signal propagation delays. Furthermore, since all the stitches are physically and electrically identical, it may be advantageous to transpose the electrical connections between one stitch and the non-memory circuitry connected thereto with those of another stitch in order to physically shorten and thereby simplify the electrical connections between each stitch and the inter-connected non-memory circuitry. Moreover, the individual circuits (e.g. the address row decoders in the seed) which implement each column in the seed and stitch need not be contiguous either but instead can be separated by other circuitry situated in the intervening cells. If the stitches are not contiguous, then "Jump" cell macros can be positioned between the separated stitches in order to interconnect the rowlines of the non-contiguous stitches. In a similar fashion, a jump cell macro can be used to inter-connect a seed to a non-contiguously positioned stitch. A jump cell is merely a metallization pattern that is placed above and spans the circuitry that is implemented in any intervening cell situated between the stitches. Moreover, if the cells that form two successive rows in a seed and/or stitch are non-contiguous, appropriate jump cells could be used to interconnect these non-contiguous cells. Hence, the embedded memory can possess any of a variety of different layout arrangements.

Although various embodiments of the present invention have been shown and described above, many other embodiments containing the teachings of the present invention may be readily constructed by those skilled in the art.

We claim:

1. A method of defining a memory that is to be embedded in a masterslice containing U rows and V columns of cells, said memory having M bits in each of N individually addressable storage locations, wherein said memory occupies a cellular array of X rows and Y columns of the cells on the masterslice (where M, N, U, V, X and Y are integers such that U>X>N and V>Y>M), said method comprising the steps of:

defining a first column of said memory wherein a layout macro for an address decoder, containing a first horizontally oriented rowline, is positioned in each of N cells in a first column of X cells of said array, so as to provide N separate address decoders in the first column of said memory;

defining a second column of said memory wherein a layout macro for a memory cell, containing a second horizontally oriented rowline, is positioned in each of N cells in a second column of X cells of said array so as to provide N separate memory cells in said second column of the memory such that the second horizontally oriented rowline positioned in each of said N memory cells in the second column of the memory is vertically aligned with a corresponding one of said first horizontally oriented rowlines in the first column of the memory; and successively replacing a layout macro for the entire second column of the array a sufficient number of times in successive remaining columns of said array outwardly spaced from said first column of the array so as to provide said memory having no more than N individually addressable storage locations with no more than M separate bits in each of said N locations.

2. The method in claim 1 further comprising the steps of:

defining a "stitch" macro as being the entire layout macro for the second column of the array; and replicating the stitch macro a sufficient number of times in successive contiguous columns of said array outwardly spaced from either said first or said second column of cells so as to provide said M bits in each of said N storage locations of the memory.

3. The method in claim 2 further comprising the steps of:

positioning jump cells between corresponding memory cells located in non-contiguous stitches in order to join the rowlines appearing in said non-contiguous stitches.

4. The method in claim 2 wherein the cells comprising each of said N cells in said first and second columns of the memory are continguous to one another.

5. The method in claim 4 wherein the first column defining step includes the step of:

positioning a metallization pattern for a vertically oriented address bus, having an appropriate number of signal lines therein, over each of said address decoders in said first column of the array; and connecting selected lines appearing in said address bus metallization pattern to appropriate address input points in a corresponding one of each of said N address decoders in said first column of the array.

6. The method in claim 5 wherein the second column defining step includes the step of positioning each memory cell layout macro in said second column of the array adjacent to a corresponding decoder layout macro appearing in said first column of the array.

7. The method in claim 6 wherein the second column positioning step further includes the step of positioning the second column of the memory to the right of said first column of the memory.

8. The method in claim 7 further comprising the step of defining a "seed" macro as being an entire layout macro for said first and second columns of cells in said array; and wherein the stitch macro replicating step includes the step of positioning the stitch macro in each of M-1 successive contiguous columns of the array outwardly spaced from the right side of said seed macro.

9. The method in claim 5 wherein said second column defining step further includes the steps of:

positioning a layout macro for a data transfer circuit in each of X-N cells remaining in said second column of the array; and extending a vertically oriented bitline between each of said N memory cells in said second column of the array and one of said data transfer circuits positioned therein.

10. The method in claim 9 wherein said data transfer circuit macro positioning step includes the step of incorporating at least one read or write circuit in each cell of said X-N cells in said second column of the array.

11. The method in claim 5 wherein the first column defining step further includes the steps of:

positioning a layout macro for a true/complement generator in each of X-N cells remaining in said first column of the array so as to define X-N separate true/complement generators; and connecting at least one corresponding line appearing in said address bus to an appropriate output point in a corresponding one of said X-N true/complement generators.

12. A method of defining a memory that is to be embedded in a masterslice containing U rows and V columns of cells, said memory having M bits in each of N individually addressable storage locations, wherein said memory occupies a cellular array of X rows and Y columns of the cells on the masterslice (where M, N, U, V, X and Y are integers such that U>X>N and V>Y>M), said method comprising the steps of:

defining a first column of said memory wherein a layout macro for an address decoder, containing a first horizontally oriented rowline, is positioned in each of N contiguous cells in a first column of X cells of said array so as to provide N separate address decoders in said first column of the memory;

defining a second column of said memory wherein a layout macro for a memory cell, containing a second horizontally oriented rowline, is positioned in each of N contiguous cells in a second column of said array so as to provide N separate memory cells in said second column of said memory such that said second horizontally oriented rowline positioned in each of said N memory cells in said second column of the memory is vertically aligned with a corresponding one of said first horizontally oriented rowlines in said first column of the memory;

defining a "stitch" macro as being an entire layout macro for the second column of the array; and successively replicating the stitch macro a sufficient number of times in successive contiguous remaining columns of said array outwardly spaced from either said first or said second column of cells in said array so as to provide said memory having no more than N individually addressable storage locations with no more than M separate bits in each of said N locations.

13. The method in claim 12 wherein the first column defining step includes the step of:

positioning a metallization pattern for a vertically oriented address bus, having an appropriate number of signal lines therein, over each of said address decoders in said first column of the array, and connecting selected lines appearing in said address bus metallization pattern to appropriate address input points in a corresponding one of each of said N address decoders in said first column of the array.

14. The method in claim 13 wherein the second column defining step includes the step of positioning each memory cell layout macro in said second column of the array adjacent to a corresponding decoder layout macro appearing in said first column of the array.

15. The method in claim 14 wherein the second column positioning step further includes the step of positioning the second column of the memory to the right of said first column of the memory.

16. The method in claim 15 further comprising the step of defining a "seed" macro as being an entire layout macro for said first and second column columns of cells in said array; and wherein the stitch macro replicating step includes the step of positioning the stitch macro in each of M-1 successive contiguous columns of the array outwardly spaced from the right side of said seed macro.

17. The method in claim 13 wherein said second column defining step further includes the ateps of:

positioning a layout macro for a data transfer circuit in each of X-N cells remaining in said second column of the array; and extending a vertically oriented bitline between each of said N memory cells in said second column of the array and one of said data transfer circuit positioned therein.

18. The method in claim 17 wherein said data transfer circuit macro positioning step includes the step of incorporating at least one read or write circuit in each cell in said X-N cells in said second column of the array.

19. The method in claim 15 wherein the first column defining step further includes the steps of:

positioning a layout macro for a true/complement generator in each of X-N cells remaining in said first column of the array in order to define X-N separate true/complement generators; and connecting at least one corresponding line appearing in said address bus to an appropriate output point in a corresponding one of said X-N true/complement generators.

20. A method of defining a memory that is to be embedded in a masterslice containing U rows and V columns of cells, said memory having M bits in each of N individually addressable storage locations, wherein said memory occupies a cellular array of X rows and Y columns of the cells on the masterslice (where M, N, U, V, X and Y are integers such that $U>X>N$ and $V>Y>M$), said method comprising the steps of:

defining a first column of said memory wherein a layout macro for an address decoder, containing a first horizontally oriented rowline, is positioned in each of N contiguous cells in a first column of X cells of said array so as to provide N separate address decoders in said first column of the memory;

defining a second column of said memory wherein a layout macro for a memory cell, containing a second horizontally oriented rowline, is positioned in each of N contiguous cells in a second column of said array so as to provide N separate memory cells in said second column of the memory, wherein said second column of the memory is situated such that each of said N memory cells located in said second column is adjacent to a corresponding one of said N address decoders located in said first column of the memory, and wherein said second horizontally oriented rowline positioned in each of said N memory cells in said second column of the memory is vertically aligned with a corresponding one of said first horizontally oriented rowlines in said first column of the memory;

defining a "seed" macro as being an entire layout macro for said first and second columns of in said array;

defining a "stitch" macro as being an entire layout macro for the second column of said array; and successively replicating the stitch macro a sufficient number of times in successive contiguous remaining columns of said array outwardly spaced from said seed macro so as to provide said memory having no more than N individually addressable storage locations with no more than M separate bits in each of said N locations.

21. The method in claim 20 wherein said second column defining step further includes the steps of:

positioning a layout macro for a data transfer circuit in each of X-N cells remaining in said second column of the array; and extending a vertically oriented bitline between each of said N memory cells in said second column of the array and one of said data transfer circuits positioned therein.

22. The method in claim 21 wherein said data transfer circuit macro positioning step includes the step of incorporating at least one read or write circuit in each cell of said X-N cells in said second column of the array.

23. The method in claim 20 wherein the first column defining step further includes the steps of:

positioning a metallization pattern for a vertically oriented address bus, having an appropriate number of signal lines therein, over each of said address decoders in said first column of the array;

connecting selected lines appearing in said address bus metallization pattern to appropriate address input points in a corresponding one of each of said N address decoders in said first column of the array;

positioning a layout macro for a true/complement generator in each of X-N cells remaining in said first column of the array so as to define X-N separate true complement generators; and connecting at least one corresponding line appearing in said address bus to an appropriate output point in a corresponding one of said X-N true/complement generators.

* * * * *

UNITED STATES PATENT AND TRADEMARK OFFICE
CERTIFICATE OF CORRECTION

PATENT NO. : 4,775,942

DATED : October 4, 1988

INVENTOR(S) : Raymond J. Ferreri et al.

It is certified that error appears in the above-identified patent and that said Letters Patent is hereby corrected as shown below:

Colum 7, line 37, change "now address decoder." to read --row address decoder.--.

Column 7, line 37, change "address row decoder," to read --row address decoder,--.

Column 7, line 38, change "address decoder" to --address decoders--.

Column 14, line 20, change "through write" to read --through right write--.

Column 15, line 56, change "level--(here ground)" to read --level (here ground)-- --.

Column 21, line 30, delete "column".

Column 21, line 37, change "ateps" to read --steps--.

Signed and Sealed this

Twelfth Day of June, 1990

Attest:

HARRY F. MANBECK, JR.

*Attesting Officer*  *Commissioner of Patents and Trademarks*